United States Patent [19]

Sheng

[11] 4,004,243

[45] Jan. 18, 1977

[54] AMPLIFIER WITH CURRENT GAIN INVERSELY PROPORTIONAL TO TRANSISTOR Hfe

[75] Inventor: Abel Ching Nam Sheng, Morris Plains, N.J.

[73] Assignee: RCA Corporation, New York, N.Y.

[22] Filed: Nov. 19, 1975

[21] Appl. No.: 633,479

[52] U.S. Cl. .............................. 330/22; 323/4; 330/17; 330/19; 330/28

[51] Int. Cl.² .................................... H03F 3/04

[58] Field of Search ............. 323/4; 330/17, 19, 22, 330/28

[56] References Cited

UNITED STATES PATENTS 3,611,170  10/1971  Wheatley, Jr. .................. 330/17 X Primary Examiner—R. V. Rolinec
Assistant Examiner—Lawrence J. Dahl
Attorney, Agent, or Firm—H. Christoffersen; S. Cohen; A. L. Limberg

[57] ABSTRACT

A first transistor of a first conductivity type connected as a common-base amplifier in the collector-to-base feedback connection of a second transistor of a second conductivity type, complementary to the first conductivity type, exchanges base current with a third transistor of the second conductivity type. The collector current of the third transistor is proportional to that of the second transistor by a factor substantially equal to $1/h_{fe}$, where $h_{fe}$ is the common-emitter forward current gain of the first transistor.

7 Claims, 4 Drawing Figures

AMPLIFIER WITH CURRENT GAIN INVERSELY PROPORTIONAL TO TRANSISTOR $H_{fe}$

The present invention relates to amplifiers with a current gain substantially inversely proportional to the common-emitter forward current gain $h_{fe}$ of a transistor, which amplifiers may be constructed in monolithic integrated circuit form.

Amplifiers of this general type are known from U.S. Pat. Nos. 3,846,696, 3,855,540, 3,855,541, 3,878,471, 3,886,466, 3,887,880 and 3,891,935. It is a continuing design objective to design such amplifiers with a minimum number of components.

Amplifiers with current gain inversely proportional to $h_{fe}$ can be constructed in accordance with the present invention with as few as three transistors, the first being of complementary conductivity type to the second and third. The second transistor has a collector-to-base feedback connection to condition it to accept an input current applied between its emitter and collector electrodes, and the first transistor is connected as a common-base amplifier in this feedback connection. The first transistor exchanges its resultant base current with the third transistor, conditioning its collector current to be related to that of the second transistor by a factor substantially equal to the reciprocal of the $h_{fe}$ of the first transistor.

IN THE DRAWING

Figure 1:
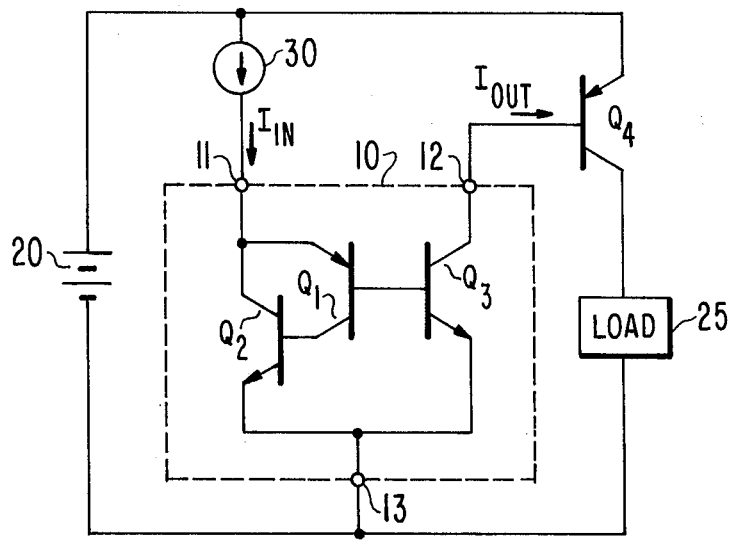
FIG. 1 shows an amplifier embodying the present invention.

In FIG. 1, terminals 11, 12 and 13 are the input terminal, output terminal, and common terminal, respectively, of the three-terminal amplifier 10 which includes transistors $Q_1$, $Q_2$ and $Q_3$. Amplifier 10 exhibits a current gain between its terminals 11 and 12 substantially inversely proportional to the $h_{fe}$ of $Q_1$ and is shown being used to supply base bias current to a transistor $Q_4$. $Q_2$ and $Q_3$ have substantially equal $h_{fe}$'s substantially in excess of unity. The collector-to-emitter path of $Q_4$ is connected in loop with a load 25 with a direct current path therethrough and a voltage supply 20, that reverse-biases the collector-base junction of $Q_4$. A constant-current source 30 is shown applying input current between terminals 11 and 13 of amplifier 10, which input current is positive, responsive to which amplifier 10 supplies from its output terminal 13 a negative base bias current $I_{OUT}$ to $Q_4$.

In deriving the expression for current gain of amplifier 10, the $h_{fe}$ of $Q_1$ will be identified as $\beta_{PNP}$, and the $h_{fe}$'s of $Q_2$ and $Q_3$, as $\beta_{NPN}$. To supply a collector current $I_{OUT}$, $Q_3$ must be supplied a base current $I_{OUT}/\beta_{NPN}$ from the base electrode of $Q_1$. The collector and emitter currents of $Q_1$ must be $\beta_{PNP}I_{OUT}/\beta_{NPN}$ and $(\beta_{PNP}+1)I_{OUT}/\beta_{NPN}$, respectively. Responsive to the $\beta_{PNP}I_{OUT}/\beta_{NPN}$ collector current of $Q_1$, $Q_2$ will have a collector current larger by $\beta_{NPN}$—that is, a collector current of $\beta_{PNP}I_{OUT}$. Source 30 must extract a current $-I_{IN}$ equal to the sum of the collector current of $Q_2$ and the emitter current of $Q_1$. That is, $-I_{IN} = \beta_{PNP}I_{OUT} + (\beta_{PNP}+1)I_{OUT}/\beta_{NPN}$. These conditions are maintained by the collector-to-base feedback of $Q_2$, applied via the common-base amplifier connection of $Q_1$, adjusting the collector current of $Q_2$ to substantially equal the current demanded by constant-current source 30.

The following expression can be written for the current gain $G_{11\text{-}12}$ between terminals 11 and 12, in accordance with the preceding observations concerning the currents in FIG. 1.

$$G_{11-12} = \frac{I_{OUT}}{I_{IN}} = \frac{I_{OUT}}{-[\beta_{PNP}I_{OUT} + (\beta_{PNP}+1) I_{OUT}/\beta_{NPN}]} = \frac{-1}{\beta_{PNP} + [(\beta_{PNP}+1)/\beta_{NPN}]} \quad (1)$$

If $\beta_{NPN}$ is close to or greater than $\beta_{PNP}$ in value (as is, the case in monolithic integrated circuitry using vertical-structure NPN transistors and lateral-structure PNP transistors), then $G_{11\text{-}12}$ is substantially equal to $-1/\beta_{PNP}$. That is, $G_{11\text{-}12}$ is substantially inversely proportional to the $h_{fe}$, $h_{feQ_1}$, of $Q_1$. The configuration can also be used applying a regulated current to common terminal 13 responsive to which the currents at the terminals 11, 12, 13 are in substantially $1:h_{fe}:(h_{fe}+1)$ ratio, the $h_{fe}$ being that of $Q_1$.

The invention may be embodied in a configuration like that of FIG. 1 but using PNP's and NPN's, respectively, in place of the NPN's and PNP's. The gain equation will then take the following form.

$$G_{11'-12'} = \frac{I_{OUT}}{I_{IN}} = -\frac{1}{\beta_{NPN} + [(\beta_{NPN}+1)/\beta_{PNP}]} \quad (2)$$

$\beta_{PNP}$ tends to be smaller than $\beta_{NPN}$ in monolithic circuits using vertical-structure NPN's and lateral-structure PNP's and so there may be difficulty in reducing the $(\beta_{NPN}+1)/\beta_{PNP}$ term to be negligible compared to the $\beta_{NPN}$ term.

Figure 2:
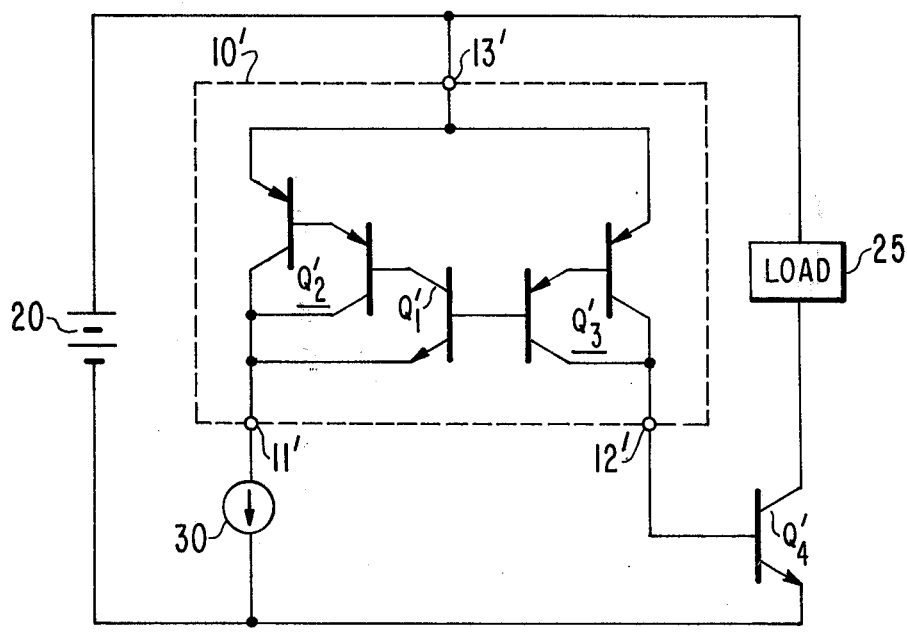
FIGS. 2, 3 and 4 show representative modifications of the FIG. 1 amplifier, also embodying the present invention.

FIG. 2 shows a configuration 10' wherein the PNP's of FIG. 1 are replaced by NPN's and the NPN's, by Darlington cascade connections $Q_2'$, $Q_3'$ of PNP's. The Darlington cascade connections each provide a composite PNP transistor with a larger effective common emitter forward current gain than that of a single transistor. So $G_{11'-12'}$ is closer to the $-1/\beta_{NPN}$ ideal. One may, however, ascribe the $(\beta_{NPN}+1)/\beta_{PNP}$ term to the emitter current of $Q_1$ flowing through terminal 11. Reducing the portion of $I_{IN}$ flowing as emitter current to $Q_1$ would improve the exactitude with which $G_{11'-12'}$ approximates $-1/h_{feQ_1}$.

Figure 3:
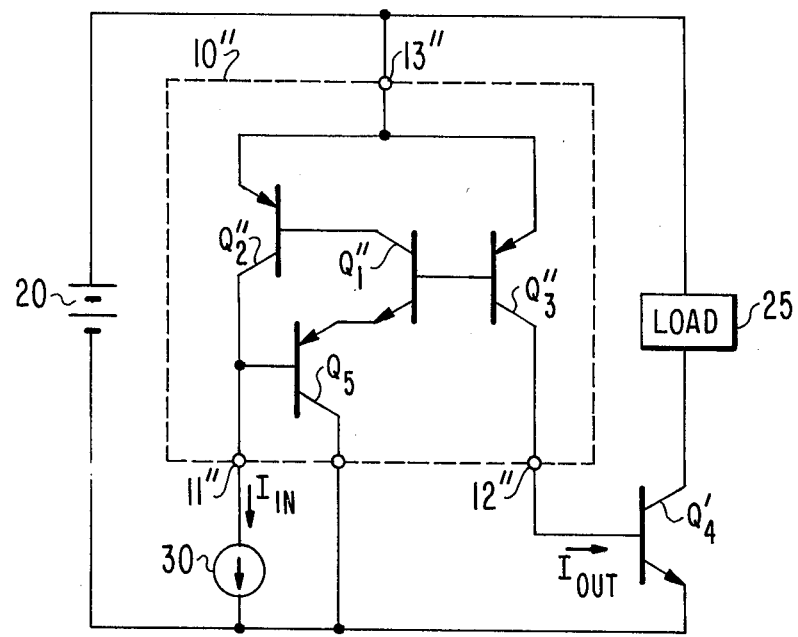

FIG. 3 shows the portion of the emitter current of $Q_1''$ flowing through input terminal $11''$ reduced by the current gain of emitter-follower transistor $Q_5$. $Q_5$, being a common-collector amplifier, is fabricable as a vertical structure PNP in a monolithic structure and so takes up little area on the integrated circuit die. $Q_5$ may be replaced with an emitter-follower transistor of complementary type, but a current conductive path will then have to couple the emitter electrodes of the replacement transistor and $Q_1''$ to a point of relatively negative-potential to condition them for flow of emitter currents. Other, higher current gain amplifiers may also replace emitter-follower transistor $Q_5$.

Figure 4:
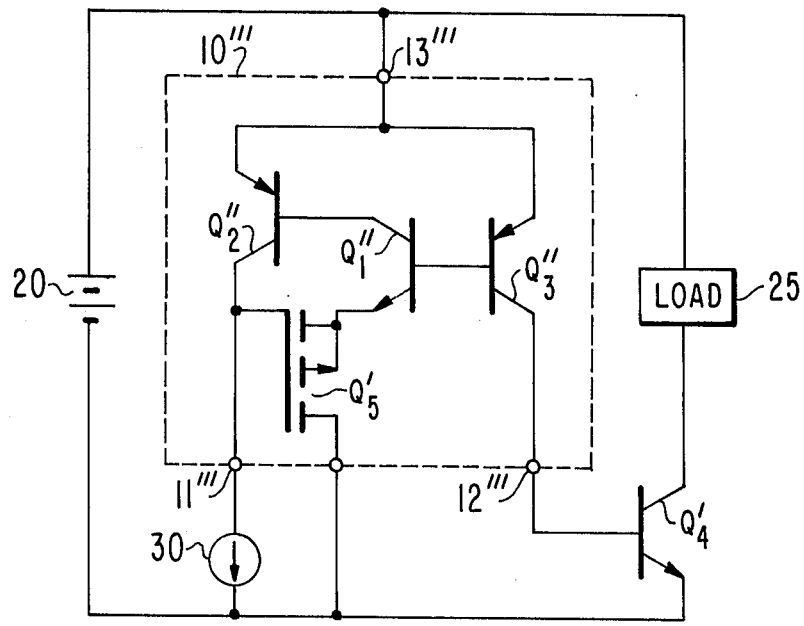

FIG. 4 shows a field effect transistor $Q_5$, used as a source-follower to replace emitter-follower transistor $Q_5$. $Q_5'$ shunts the entire emitter current of $Q_1''$ away from the input terminal $11'''$ to the negative terminal of supply 20.

What is claimed is:

1. In combination:
a first bipolar transistor of a first conductivity type, said first transistor having base and emitter and collector electrodes;
second and third bipolar transistors of a second conductivity type complementary to said first conductivity type, each of said second and third transistors having base and emitter and collector electrodes and exhibiting current gain similar to that of the other;
a collector-to-base feedback connection of said second transistor to condition it to accept input current applied between its collector and emitter electrodes, said feedback connection including:
a fifth, potential-follower transistor having an input electrode to which the collector electrode of said second transistor is connected and having an output electrode; and
a common-base amplifier connection of said first transistor including a connection of the output electrode of said fifth transistor to the emitter electrode of said first transistor and including a connection of the collector electrode of said first transistor to the base electrode of said second transistor; and
a base-to-base connection of said first and said third transistors, whereby said third transistor is conditioned for a collector current flow provided as an output current.

2. A combination as set forth in claim 1 wherein said fifth transistor is a bipolar transistor connected in an emitter-follower configuration, with a base electrode corresponding to said input electrode and an emitter electrode corresponding to said output electrode.

3. A combination as set forth in claim 1 wherein said fifth transistor is a field-effect transistor connected in a source-follower configuration with a gate electrode corresponding to said input electrode and with a source electrode corresponding to said output electrode.

4. A circuit for supplying quiescent base bias current to a first bipolar transistor as set forth in claim 3 wherein said third and said fourth transistors are each a composite transistor comprising the Darlington cascade connection of a plurality of compound transistors.

5. An amplifier with a current gain substantially inversely proportion to $h_{fe}$, the common-emitter amplifier forward current gain of a transistor of a first conductivity type operated in conjunction therewith, which transistor has a base electrode, said amplifier comprising:
input, output and common terminals, said input and common terminals for receiving an input current applied therebetween, said current gain inversely proportional to transistor $h_{fe}$ being between said input and output terminals;
a first transistor of a first conductivity type, said first transistor having base and emitter and collector electrodes and exhibiting a current gain of $h_{fe}$ between its base and collector electrodes to which said current gain of said amplifier is to be substantially inversely proportioned;
second and third transistors of a second conductivity type, complementary to said first conductivity type, each having base and emitter and collector electrodes and exhibiting similar current gains to each other, said output terminal being at the collector electrode of said third transistor;
first current conductive means connecting said input terminal to the emitter electrode of said first transistor;
second current conductive means connecting the collector electrode of said first transistor to the base electrode of said second transistor;
third current conductive means connecting the emitter electrode of said second transistor to said common terminal;
fourth current conductive means connecting the collector electrode of said second transistor to said input terminal;
fifth current conductive means connecting the base electrodes of said first and said third transistors;
sixth current conductive means connecting the emitter electrode of said third transistor to said common terminal; and
means responsive to the collector current of said third transistor for continually applying a like-valued quiescent base current to said transistor operated in conjunction with the amplifier.

6. An amplifier as set forth in claim 5 wherein said means responsive to the collector current of said third transistor for continually applying a like-valued quiescent base current to said transistor operated in conjunction with the amplifier consists of a direct connection of the collector electrode of said third transistor to the base electrode of said transistor operated in conjunction with the amplifier.

7. A circuit for supplying quiescent base bias current to a first bipolar transistor of a first conductivity type, said first bipolar transistor having a base electrode, which circuit comprises:
a second bipolar transistor of said first conductivity type, said second transistor having base and emitter and collector electrodes;
third and fourth bipolar transistors of a second conductivity type complementary to said first conductivity type, each of said third and said fourth transistors having base and emitter and collector electrodes and exhibiting current gain similar to that of the other;
a collector-to-base feedback connection of said third transistor to condition it to accept input current applied between its collector and emitter electrodes, said feedback connection including
a common-base amplifier connection of said second transistor with its emitter electrode having the collector electrode of said third transistor connected thereto and with its collector electrode being connected to the base electrode of said third transistor; and
a base-to-base connection of said second and said fourth transistors; and
means for applying the collector current flowing through the collector electrode of said fourth transistor to the base electrode of said first bipolar transistor as the entire said quiescent base bias current.

* * * * *